United States Patent [19]

Hermansen et al.

[11] Patent Number: 5,367,006
[45] Date of Patent: Nov. 22, 1994

[54] SUPERIOR THERMAL TRANSFER ADHESIVE

[75] Inventors: Ralph D. Hermansen, Northridge; Steven E. Lau, Los Angeles, both of Calif.

[73] Assignee: Hughes Aircraft Company, Los Angeles, Calif.

[21] Appl. No.: 178,341

[22] Filed: Jan. 6, 1994

Related U.S. Application Data

[63] Continuation of Ser. No. 852,059, Mar. 16, 1992, abandoned.

[51] Int. Cl.$^5$ .......................... C08K 3/22; C08K 3/36; C09J 163/02; C09J 163/04; C08G 59/08; C08G 59/36; C08G 59/38
[52] U.S. Cl. ................................... 523/428; 523/466; 525/484
[58] Field of Search ................... 523/428, 466; 525/484

[56] References Cited

U.S. PATENT DOCUMENTS

| | | |
|---|---|---|
| 3,256,135 | 6/1966 | Weinheimer ..................... 523/466 |
| 4,195,001 | 3/1980 | Lytton . | |
| 4,304,694 | 12/1981 | Scola ............................. 523/428 |
| 4,525,542 | 6/1985 | DeGooyer ...................... 525/484 |
| 4,798,761 | 1/1989 | Wykowski ..................... 523/428 |
| 4,866,108 | 9/1989 | Vachon et al. . | |

FOREIGN PATENT DOCUMENTS 4521 1/1985 Japan ................................... 523/466

2077271 12/1981 United Kingdom ................. 523/466

OTHER PUBLICATIONS

H. Lee & K. Neville, "Handbook of Epoxy Resins", McGraw-Hill Book Co, N.Y., Reissue 1982, pp. 6/22, 16/1-7 and 10/2.

Primary Examiner—John C. Bleutge
Assistant Examiner—D. R. Wilson
Attorney, Agent, or Firm—M. E. Lachman; M. W. Sales; W. K. Denson-Low

[57] ABSTRACT

A superior thermal transfer film adhesive comprises the following composition: (a) at least one aliphatic epoxy resin; (b) a stoichiometric amount of at least one aliphatic polyamine curative; (c) an effective amount of a thixotropic agent, such as fumed silica; and (d) about 20 to 50 volume percent of at least one filler, such as alumina, based on the total of the epoxy resin and the curative. The aliphatic epoxy resin has aliphatic pendant chains of 6 to 20 carbon atoms in length. The curative comprises a long chain aliphatic or cycloaliphatic curing agent for the epoxy resin. Since aliphatic moieties, which are flexible, are used, the glass transition temperature of the resulting cured material is lower than epoxies and plasticizers employing rigid moieties. The adhesive of the invention is novel in attaining high volume resistivity (at least $10^{14}$ ohm-cm at 25° C.), low temperature flexibility (−55° C.), excellent adhesion for maximum thermal transfer, and ease of reworkability.

2 Claims, No Drawings

SUPERIOR THERMAL TRANSFER ADHESIVE

This invention was made with United States Government support under Contract No. CLAS WNG-A-900. The U.S. Government has certain rights in this invention.

This is a continuation of application Ser. No. 07/852,059, filed Mar. 16, 1992, now abandoned.

BACKGROUND OF THE INVENTION

1. Field of the Invention

The present invention relates generally to adhesives used to bond electronic components to circuit boards, and, more particularly, to flexible epoxy-based compounds having high electrical resistivity and improved thermal transfer characteristics.

2. Description of Related Art

The design and fabrication of electronics often involve bonding the electronic components to circuit boards using flexible epoxy adhesives. U.S. Pat. No. 4,866,108, assigned to the present assignee, discloses and claims one such flexible epoxy adhesive composition. The composition comprises a mixture of a fatty acid modified epoxy resin and an oxypropylene polyether epoxy resin in the ratio of about 1:3 to 1:1. The adhesive also includes a stoichiometric amount of a polyamine curing agent, 1 to 20 total liquid weight percent of a plasticizer, 50 to 80 weight percent of aluminum oxide, and 1 to 5 weight percent of microfine silicon dioxide particles. This adhesive is particularly well-suited for use as a flat pack adhesive to provide a releasable bond and is also well-suited for use in space applications. While this adhesive is very useful for its intended purposes, it has volume resistivity values which are typically $10^{10}$ to $10^{12}$ ohm-cm at 25° C. It has been found that certain electronic circuits, such as multiplexers, require volume resistivities greater than $10^{13}$ ohm-cm at 25° C. and greater than $10^{11}$ ohm-cm at 95° C. to minimize cross-talk and other problems.

Further, this prior adhesive evidences glass transition temperatures on the order of $-10°$ to $-20°$ C. Such glass transition temperatures indicate the possibility of the filleting material becoming rigid in its service temperature range, which could result in the cracking of the bonded components, such as glass-bodied diodes. Lower glass transition temperatures, on the other hand, imply that the filleting material remains elastomeric throughout the service temperature range. Lower glass transition temperatures are needed to retain flexibility over the application temperature range of about $-50°$ to 125° C. By "lower" glass transition temperatures is meant less than about $-30°$ C.

Accordingly, a need remains for a flexible film adhesive having a volume resistivity in excess of $10^{13}$ ohm-cm at 25° C. and in excess of $10^{11}$ ohm-cm at 95° C., low temperature flexibility, excellent adhesion, and ease of reworkability.

SUMMARY OF THE INVENTION

In accordance with the invention, a superior thermal transfer film adhesive is provided, comprising the following composition: (a) at least one aliphatic epoxy resin; (b) a stoichiometric amount of at least one aliphatic polyamine curative; (c) an effective amount of a thixotropic agent; and (d) about 20 to 50 volume percent of at least one filler. Other components may be optionally added, including about 1 to 2 weight percent of a monoepoxide diluent and/or about 1 to 5 weight percent of a plasticizer.

The flexible epoxy resin comprises an aliphatic epoxy resin with aliphatic pendant chains of 6 to 20 carbon atoms in length. The curative comprises a long chain aliphatic or cycloaliphatic polyamine curing agent, having 5 or more carbon atoms between amine groups, for the epoxy resin. Since aliphatic moieties, which are flexible, are used, then the glass transition temperature of the resulting cured material is lower than epoxies employing rigid moieties. In addition, aliphatic pendant chains are not functionally terminated and therefore provide internal plasticization of the polymer.

The adhesive of the invention is novel in attaining high volume resistivity (at least $10^{14}$ ohm-cm at 25° C. and at least $10^{11}$ ohm-cm at 95° C.), low temperature flexibility (to $-55°$ C), sufficient adhesion for maximum thermal transfer, and ease of reworkability. Also, thermal conductivity is about 50% higher than that possessed by the compositions of U.S. Pat. No. 4,866,108. While the formulation of that patent is suitable for flat pack adhesives, the formulation of the present invention is suitable for flat pack adhesives (in film form or paste form) and for filleting material (in paste form) for adhering discrete components, such as resistors, capacitors, diodes, etc., to a circuit board.

DESCRIPTION OF THE PREFERRED EMBODIMENTS

The composition of the invention comprises: (a) at least one aliphatic epoxy resin; (b) a stoichiometric amount of at least one aliphatic polyamine curative; (c) an effective amount of a thixotropic agent; and (d) about 20 to 50 volume percent (vol %) of at least one filler. Other components may be optionally added, including about 1 to 2 weight percent (wt %) of a monoepoxide diluent and/or about 1 to 5 weight percent of a plasticizer.

The resin or resins may comprise any of the aliphatic epoxy resins with aliphatic pendant chains of 6 to 20 carbon atoms in length, such as the trifunctional novolac epoxy of cardanol (available from Cardolite Corp., Newark, N.J., under the trade designation NC547) and the difunctional epoxy of cardanol (available from Cardolite Corp. under the trade designation NC514). Examples of other aliphatic epoxy resins suitably employed in the practice of the invention include the diglycidyl ester of linoleic dimer acid (available from Shell Corp., Houston, Tex., under the trade designation EPON 871), the adduct of two moles of bis-phenol A with one mole of the diglycidyl ester of linoleic dimer acid (available from Shell Corp. under the trade designation EPON 872), and the diglycidyl ether of 2,2-bis(4-hydroxyphenyl)nonadecane.

The polyamine curative or curatives may comprise a long chain (5 or more carbon atoms between amine groups) aliphatic or cycloaliphatic compound. Examples include the diprimary amine of linoleic dimer acid obtained by hydrogenation of the dimer nitrile which is formed by reaction of the dimer acid with ammonia (available from Humko Chemical Division of Witco Chemical Corp., Memphis, Tenn., under the trade designation Kemamine DP3680), N,N'-bis(3-aminopropyl) dimer diamine (available from Humko under the trade designation Kemamine DD3680), 1,6-hexanediamine, 2-methylpentanediamine, and dodecane diamine.

While the amount of curative is preferably in stoichiometric proportion relative to the aliphatic epoxy, the amount of curative may be varied about ±10% from stoichiometry, with little adverse effect on the final product.

The combination of the class of aliphatic epoxy resins and the class of aliphatic polyamine curatives with a long chain aliphatic group results in a flexible material, which, when cured, has a lower glass transition temperature than epoxies made with rigid moieties. The resulting glass transition temperature ranges from about $-10°$ to $-60°$ C., as compared with epoxies with rigid moieties, which typically have glass transition temperatures in excess of 100° C.

Part of the novelty of the invention resides in the maximization of the length of the aliphatic resin and of the curative and of the number of pendant chains in the polymer. A large number of pendant chains in the polymer gives a lower glass transition temperature and hardness value than would otherwise be achieved.

The thixotropic agent may comprise any of the well-known materials for this purpose, such as fumed silica and fine particle fillers such as clays, especially bentonite clays, and talc. The particle size of the thixotropic agent ranges from about 0.01 to 0.1 micrometers. Preferably, fumed silica is employed.

The thixotropic agent is used in the film adhesive to keep the resin binder in suspension with the mineral filler and prevents separation during cure, while the thixotropic agent is used in the filleting adhesive to reduce the flow of the paste.

The amount of thixotropic agent in either case is that amount which is effective in producing the desired thixotropic properties of the final product, i.e., that amount which prevents the paste or film from flowing under its own weight. Simple experimentation will readily determine the appropriate amount. In the case of fumed silica, an amount of about 0.5 to 5.0 volume percent is desirably employed.

The filler or fillers may comprise any of the well-known thermally conductive fillers, such as alumina, aluminum nitride, boron nitride, silicon carbide, and the like. Preferably, a filler having a high dielectric strength is employed. In this connection, in order to electrically isolate components from the printed circuit board and thereby prevent shorts or current leakage, the dielectric strength of the cured polymer should be at least about 350 V/mil (13,800 V/mm). Further, the amount of filler and its thermal conductivity should be sufficient to provide the cured polymer with a thermal conductivity of at least about 0.3 BTU/hr-ft-°F. (0.45 kcal/hr-m-°C.).

Other components may be optionally added, including about 1 to 2 weight percent of a monoepoxide diluent and/or about 1 to 5 weight percent of a plasticizer.

The function of the monoepoxide diluent is to lower the viscosity of the resin to improve its flow for impregnation, encapsulation, etc. The diluent also weakens the cohesive strength of the resin to improve its reworkability. Examples of diluents suitably employed in the practice of the invention include butyl diglycidyl ether, phenyl glycidyl ether, the glycidyl ether of cardanol, and alkyl glycidyl ethers.

The plasticizer is inert with respect to the resin and serves as a softening agent and to reduce polymer strength in order to enhance reworkability. The plasticizer must be compatible with the polymer; that is, it must not separate or bleed out. Simple experimentation to determine compatible plasticizers, such as preparing a polymer and proposed plasticizer and observing whether compatibility exists, may be done. As a starting point, using chemically similar materials may lead to compatible polymer/plasticizer combinations. As an example, the plasticizer preferably comprises a high molecular weight (greater than about 1,000, and preferably about 2,000 to 3,000) polybutadiene polyol (available from Atochem, Malvern, Pa. under the trade designations polyBD-R45HT and polyBD-R20LM). Other examples of plasticizers include poly(oxypropylene) diols and triols (available from Union Carbide, Danbury, Conn. under the trade designations LHT-34 and LHT-28).

Where the epoxy is to be used in space applications, it must be capable of passing National Aeronatics and Space Administration (NASA) outgassing requirements. These requirements are (a) TML-WVR<1.0%, where TML-WVR=total mass loss minus water vapor recovered and (b) CVCM<0.1%, where CVCM=collected volatile condensable material. A particularly preferred composition which not only meets the aforementioned criteria but also passes the NASA outgassing requirements consists essentially of:

(a) about 9 wt % of the trifunctional novolac epoxy of cardanol;
(b) about 9 wt % of the difunctional epoxy of cardanol;
(c) about 0.95 wt % of the monoepoxide of cardanol as diluent;
(d) about 7.25 wt % of the diprimary amine of linoleic dimer acid curative;
(e) about 3.8 wt % of high molecular weight polybutadiene polyol plasticizer;
(f) about 3.8 vol % fumed silica; and
(g) about 37.2 vol % tabular alumina powder (−325 mesh, or 0.04 mm).

This composition evidences a cure-to-set in 15 minutes at 200° F. (93° C.), a full cure in 1 hour at 200° F. (93° C.), a thermal conductivity of 0.48 BTU/hr-ft-°F. (0.71 kcal/hr-m-°C.), a volume resistivity of $2.4 \times 10^{14}$ ohm-cm at 75° F. (24° C.) (for paste adhesive; for film adhesive, the value is $8.0 \times 10^{14}$ ohm-cm), a volume resistivity of $2.8 \times 10^{11}$ ohm-cm at 200° F. (93° C.) (for paste adhesive; for film adhesive, the value is $2.7 \times 10^{12}$ ohm-cm), and a glass transition temperature of $-38°$ C. The TML-WVR value is 0.3%, while the CVCM value is 0.05. The dielectric strength is 716 V/mil (2,818 V/cm) for paste adhesive and 896 V/mil (3,527 V/cm) for film adhesive.

Another composition of the invention comprises the following components:

(a) about 18 wt % of the trifunctional novolac epoxy of cardanol;
(b) about 5.1 wt % of the diprimary amine of linoleic dimer acid;
(c) about 2.0 vol % of fumed silica; and
(d) about 47.3 vol % $Al_2O_3$ powder.

The aluminum oxide powder is preferably −325 mesh (0.04 mm).

This composition evidences a cure-to-set in 15 minutes at 200° F. (93° C.), a full cure in 1 hour at 200° F. (93° C.), a thermal conductivity of 0.55 BTU/hr-ft-°F. (0.82 kcal/hr-m-°C.), a volume resistivity of $2 \times 10^{14}$ ohm-cm at 75° F. (24° C.), a volume resistivity of $3 \times 10^{11}$ ohm-cm at 200° F. (93° C.), and a glass transition temperature of $-56°$ C. This composition may be employed in applications that do not have to meet the NASA outgassing requirements.

The adhesive of the invention is formulated by manually mixing the liquid components (the epoxy resins, the curatives, and the plasticizer, if any) with the dry ingredients (thixotropic agent and fillers) until the dry ingredients are thoroughly wetted. This is to avoid taking abrasives into the vacuum pump during the next processing step.

The wetted mass is then transferred into the mixing vessel of a vacuum mixer. An example of a suitable vacuum mixer is a Ross Double Planetary Mixer, Model 130, available from Charles Ross & Son Company (Happauge, N.Y.). After sealing and evacuating the mixer, the paste is mixed for a period of time at 0.25 Torr or less, using a cooling jacket if necessary to maintain the temperature of the paste at about 23° to 25° C. (to offset the heat of friction). For a 2 kg batch, mixing takes about 20 to 30 minutes to obtain a substantially homogeneous mixture. Mixing under vacuum ensures that no air is entrained in the finished paste.

After mixing is completed, the paste is dispensed into pre-labeled cartridges or syringes, the cartridges or syringes are sealed in foil-lined pouches, which are then quick-frozen in dry ice and then stored at $-40°$ F. ($-40°$ C.) until needed.

An adhesive film of the composition of the invention may be made by the following well-known process to make a panel 12 inches $\times$ 42 inches (30.5 cm $\times$ 106.7 cm):

(a) Thaw a 6 ounce (177.4 cm$^3$) cartridge of paste adhesive.
(b) Lay out 84 inches (213.4 cm) of 3 mil (0.076 mm) thick, 12 inch (30.5 cm) wide plastic or plastic-coated release film, fold in half, and crease to make 42 inch (106.7 cm) long doubled panel.
(c) Lay out and cut 42 inch (106.7 cm) length of 2-mil (0.051 mm) thick, 12 inch (30.5 cm) wide, epoxy-sized glass cloth between layers of release film with one end in the crease of the release film.
(d) Clamp crease end of cloth/release film panel in pulling bar of film coater. Feed loose end of cloth/release film panel between drawplate and drawblade and install pulling bar at start position. Adjust starting position, if necessary, using motor.
(e) Set drawblade gap for the desired film thickness plus thickness of both layers of release film.
(f) Fold top layer of release film and glass cloth over the drawblade to expose bottom layer of release film. Dispense about 75 cm$^3$ of paste along drawblade, between the glass cloth and the bottom layer of release film in a uniform bead. Fold the glass cloth over the paste and dispense another 75 cm$^3$ uniform bead of paste along the drawblade, between the glass cloth and the top layer of release film. (The amount of 75 cm$^3$ beads is based on 15-mil, or 0.38 mm, film thickness.)
(g) Start the motor and adjust the pulling speed to optimum. Depending on paste viscosity and film thickness, optimum speed will probably be about 5 to 10 inch/minute (12.7 to 25.4 cm/minute).
(h) Be prepared to redistribute paste to maintain uniformity of paste beads, to add more paste if required, and to stop pulling in the event of a jam or catch in the film being pulled.
(i) When entire panel is coated, inspect for voids in the film adhesive, and cut into the required sheet sizes.
(j) Package film adhesive sheets between cardboard backboards, with layers of kraft paper between the adhesive sheets. Seal into a zip-seal bag and then place in a heat-sealable, foil-lined, moisture-barrier bag and store in freezer at $-40°$ F. ($-40°$ C.).

EXAMPLE

A thermal transfer adhesive was formulated comprising the following ingredients in the amounts listed:

(a) about 9 wt % of the trifunctional novolac epoxy of cardanol;
(b) about 9 wt % of the difunctional epoxy of cardanol;
(c) about 0.95 wt % of the monoepoxide of cardanol as diluent;
(d) about 7.25 wt % of the diprimary amine of linoleic dimer acid curative;
(e) about 3.8 wt % of high molecular weight polybutadiene polyol plasticizer;
(f) about 3.8 vol % fumed silica; and
(g) about 37.2 vol % tabular alumina powder.

The aluminum oxide powder was $-325$ mesh (0.04 mm). The adhesive paste was prepared as described above. A film having the same composition was also prepared as described above.

Table I below lists the properties observed for both the paste form and the film form of the adhesive of the invention.

TABLE I

Properties of Thermal Transfer Adhesive - Paste and Film.

| Property | Paste | Film |
|---|---|---|
| Work Life (uncured) | | |
| (hrs) | >2 | >2 |
| lap shear$^a$ (psi)$^b$ | 391 | 334 |
| Lap Shear$^c$ (psi)$^b$ (cured) | 371 | 337 |
| Storage Life (months at $-40°$ F. ($-40°$ C.) (uncured) | 3 | 3 |
| Color (cured) | Tan | Tan |
| Volume Resistivity (cured) | | |
| $\Omega$-cm at 75° F. (24° C.) | $2.4 \times 10^{14}$ | $8.0 \times 10^{14}$ |
| $\Omega$-cm at 200° F. (93° C.) | $2.8 \times 10^{11}$ | $2.7 \times 10^{12}$ |
| Dielectric Strength (cured) | | |
| (V/mil)$^d$ | 716 | 896 |
| Dielectric Constant (cured) | | |
| 1 KHz | 5.56 | 4.80 |
| 10 KHz | 5.34 | 4.66 |
| 100 KHz | 5.16 | 4.52 |
| 1000 KHz | 5.00 | 4.40 |
| Dissipation Factor (cured) | | |
| 10 KHz | 0.011 | 0.012 |
| 100 KHz | 0.012 | 0.012 |
| 1000 KHz | 0.012 | 0.013 |
| Outgassing$^e$ (cured) | | |
| % TML-WVR | 0.32 | 0.404 |
| % CVCM | 0.046 | 0.046 |
| Thermal Conductivity (cured) | | |
| (BTU/hr-ft-°F.)$^f$ | 0.48 | 0.45 |
| Glass Transition (by TMA)$^g$ (cured) | | |
| $T_g$ (°C.) | $-38$ | |
| CTE$^h$ > $T_g$ (ppm/°C.) | 129 | |
| CTE$^h$ < $T_g$ (ppm/°C.) | 35 | |
| Hardness (Shore D) (cured) | $44 \pm 5$ | |
| Specific Gravity (cured) | $2.05 \pm 0.01$ | |
| Solvent Resistance$^i$ (cured) | | |
| (% weight gain) | 0.95 | |
| (% thickness gain) | 1.08 | |
| Construction | N/A$^j$ | 1-step |

TABLE I-continued

Properties of Thermal Transfer Adhesive - Paste and Film.

| Property | Paste | Film |
|---|---|---|
| Film Thickness (mils)[k] | N/A[j] | 14 |

Notes:
[a] After two hours at room temperature.
[b] To convert from psi (pounds per square inch) to Kg/cm² (kilograms per square centimeter), multiply by 0.070307.
[c] Freshly thawed.
[d] To convert from V/mil (volts per mil) to V/cm (volts per centimeter), divide by 0.254.
[e] TML-WVR = total mass loss minus water vapor recovered; CVCM = collected volatile condensable material.
[f] To convert from BTU/hr-ft-°F. to Kcal/hr-m-°C., multiply by 1.48816.
[g] TMA = thermogravimetric analysis.
[h] CTE = coefficient of thermal expansion.
[i] Soaked one hour in isopropanol.
[j] Not applicable.
[k] To convert from mils to cm, multiply by 0.254.

Thus, a thermal transfer adhesive/film composition is provided having a high electrical resistivity and low glass transition temperature. It will be readily apparent to those skilled in the art that various changes and modifications of an obvious nature may be made, and all such changes and modifications are considered to fall within the scope of the invention, as defined by the appended claims.

What is claimed is:

1. A thermal transfer adhesive for electronic components consisting essentially of:
   (a) about 9 wt % of the trifunctional novolac epoxy of cardanol;
   (b) about 9 wt % of the diglycidyl ether of a p-hydroxyphenylcardanol;
   (c) about 0.95 wt % of the monoepoxide of cardanol as diluent;
   (d) about 3.8 wt % of the diprimary amine of linoleic dimer acid obtained by hydrogenation of the dimer nitrile which is formed by reaction of the dimer acid with ammonia as curative;
   (e) about 7.25 wt % of polybutadiene polyol having a molecular weight greater than about 1000;
   (f) about 3.8 vol % fumed silica; and
   (g) about 37.2 vol % alumina powder.

2. A thermal transfer adhesive for electronic components consisting essentially of:
   (a) about 18 wt % of the trifunctional novolac epoxy of cardanol;
   (b) about 5.1 wt % of the diprimary amine of linoleic dimer acid obtained by hydrogenation of the dimer nitrile which is formed by reaction of the dimer acid with ammonia;
   (c) about 2.0 vol % of fumed silica; and
   (d) about 47.3 vol % $Al_2O_3$ powder.

* * * * *